United States Patent [19]

Murao et al.

[11] Patent Number: 5,032,889

[45] Date of Patent: Jul. 16, 1991

[54] WIRING STRUCTURE IN A WAFER-SCALE INTEGRATED CIRCUIT

[75] Inventors: Toshiaki Murao, Kawasaki; Takeo Kikuchi, Chofu; Toshihiko Iryu, Kawasaki; Hiroyuki Sugamoto, Aichi; Hidenori Nomura, Kasugai, all of Japan

[73] Assignee: Fujitsu Limited, Kawasaki, Japan

[21] Appl. No.: 585,515

[22] Filed: Sep. 20, 1990

[30] Foreign Application Priority Data

Sep. 20, 1989 [JP] Japan .................................. 1-244554

[51] Int. Cl.$^5$ ...................... H01L 27/02; H01L 27/10; H01L 23/48; H01L 29/46
[52] U.S. Cl. ......................................... 357/40; 357/45; 357/68; 357/71
[58] Field of Search ......................... 357/40, 45, 68, 71

[56] References Cited

U.S. PATENT DOCUMENTS 4,580,259 4/1986 Harada et al. ..................... 379/268

Primary Examiner—Mark Prenty
Attorney, Agent, or Firm—Staas & Halsey

[57] ABSTRACT

A wafer-scale integrated circuit includes a plurality of functional blocks, a plurality of respectively corresponding connection terminals being provided in each of the functional blocks. Respectively corresponding pluralities of layered wirings and bonding wires interconnect predetermined, respective ones of said corresponding connection terminals in parallel for supplying power source and other voltages in common to the plurality of functional blocks. The parallel interconnections by the layered wirings and bonding wires, due to different, respective failure modes, affording increased reliability.

7 Claims, 3 Drawing Sheets

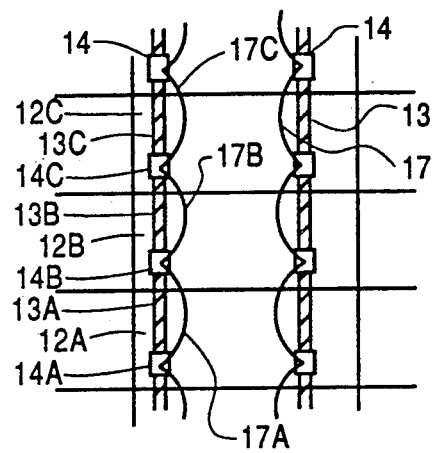 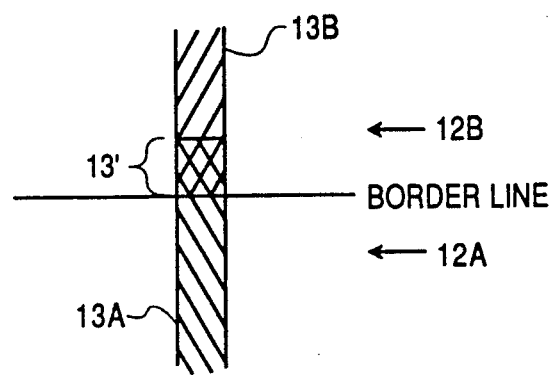
FIG. 3(a)  FIG. 3(b)
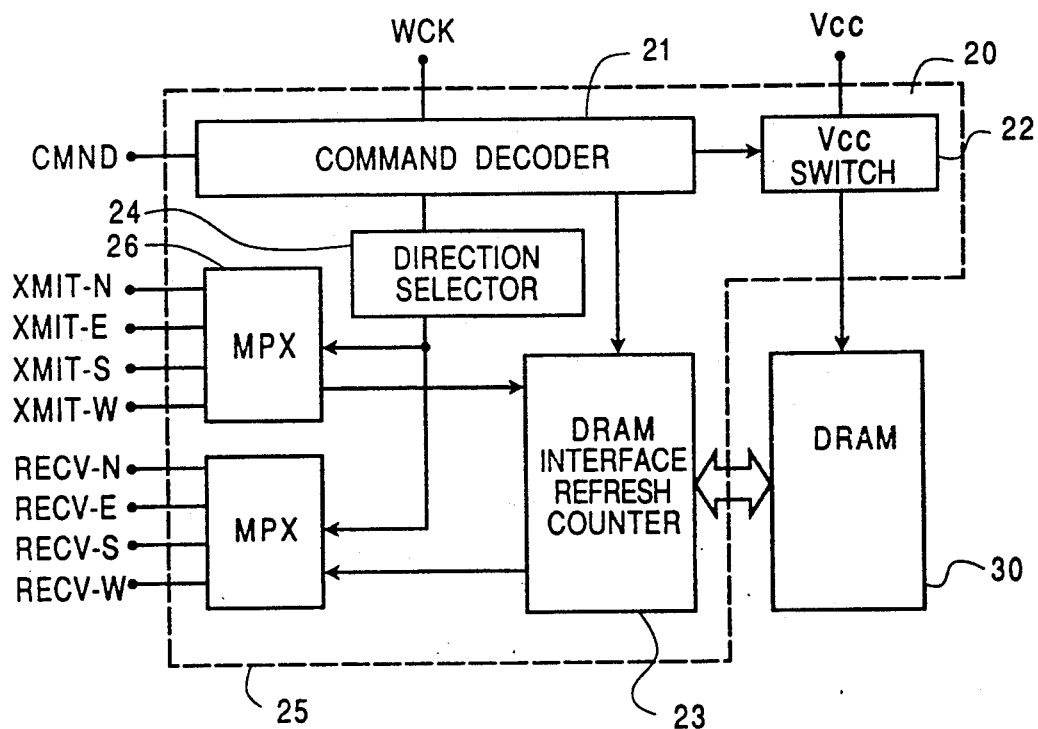
FIG. 4

WIRING STRUCTURE IN A WAFER-SCALE INTEGRATED CIRCUIT

BACKGROUND OF THE INVENTION

1. Field of the Invention

The present invention relates to a wiring structure in a semiconductor wafer-scale integrated circuit (hereinafter referred to as IC).

2. Description of the Related Art

A wafer-scale IC comprises a plurality of identical functional blocks, each having memories and logic circuits for controlling thereof, and operates as a single device without separating these blocks. Therefore, the wafer-scale IC can integrate circuits of the largest scale, larger than any other ICs, and can reduce signal delay time due to its shorter length wirings between IC chips relative to that of conventional plural ICs each having an individual IC chip in a package. Moreover, since the assembling process required for individual chips is naturally unnecessary, the circuit fabrication processes can be simplified, and accordingly the device reliability can also be improved. Therefore, recent wafer-scale ICs provide memory capacity of 200M bits on a single wafer of 15 cm in diameter.

FIG. 1 schematically shows a plan view of a wafer-scale IC. A wafer 11 having 26 rows ×9 columns of functional blocks 12 is mounted on a circuit board (not illustrated), formed of resin, etc., called a carrier. FIG. 2(a) is a plan view enlarging a part enclosed by dotted lines in FIG. 1. Each functional block 12 is fabricated by repeated exposures of a reticule of a single block, for rows and columns in a matrix, well known as a step and repeat method. Therefore, terminal electrodes (pads) 14 to supply a source voltage to each functional block are aligned on a line. Accordingly, power-supply layer-wiring 13 to supply the source voltage to each functional block is connected in series via the pads 14, and each pad 14 is connected in parallel to each functional block on line, as shown in FIG. 2(a). Wiring 13 is connected to the carrier (not illustrated) by a bonding wire via terminal electrodes (not illustrated) provided at the edge part of wafer 11, so as to receive the power source voltage. Power supply layer-wiring 13 is usually formed of a metal film pattern of about several tens of micron meters in width and about 1 μm in thickness. As this power supply layer-wiring extends from the one edge to the other edge of the wafer of as large as 15 cm diameter, its resistance and inductance are both increased. Connection to the adjacent functional block is fabricated by overlapping the patterned wiring at the connecting areas during exposure for each functional block using the reticule. However, the reticule exposure of such a large pattern cannot easily establish the alignment accuracy at the peripheral part thereof, and the wafer itself does not always have sufficient surface flatness since many layers have been already fabricated thereon, resulting in a problem of reliability in comparison with the layer wiring usually formed by a single patterning. In order to avoid the problem, power supply terminals 14 of each functional block may be connected by a bonding wire 17 as shown in FIG. 2(b), in place of layer wiring 13. Since bonding wire 17 is typically formed of aluminum or gold of 30 to 100 μm in diameter, its resistance and inductance can be remarkably lowered than layer wiring 13. However, even if a bonding wire is employed, since the power source voltage is supplied via the serially connected wirings to as many as typically twenty six functional blocks, a single wire-break causes no more power supply to all the functional blocks after the broken wiring point, resulting in a reliability problem of the device. The above explained structure, where the power supply wiring is only of a layer wiring or a bonding wire, is described in the U.S. patent application Ser. No. 359,677, issued Apr. 1, 1986 as U.S. Pat. No. 4,580,259, assigned to the same assignee of the present invention. Thus, it has long been required to provide a method of supplying the source voltage to each functional blocks, while satisfying the high reliability requirement.

SUMMARY OF THE INVENTION

It is a general object of the invention, therefore, to provide a wafer-scale integrated-circuit, formed on a single wafer, where a reliable connection of wirings to each of functional blocks fabricated therein is attained.

On a wafer-scale integrated circuit, the pad electrodes, for receiving a common voltage, provided on each of a plurality of identical functional blocks are connected with each other dually by layered wirings as well as bonding wires. Owing to the two different types of connection wirings, failure modes of the connection are different on the respective wirings, resulting in an increased reliability of the wafer scale integrated circuit. Thus dually connected wirings are advantageous particularly in the case where the wirings between adjacent functional blocks are serially connected with each other so as to commonly supply the power source voltage via the connection electrodes provided thereon to the functional blocks.

The above-mentioned features and advantages of the present invention, together with other objects and advantages, which will become apparent, will be more fully described hereinafter, with reference being made to the accompanying drawings which form a part thereof, wherein like numerals refer to like parts throughout.

BRIEF DESCRIPTION OF THE DRAWINGS

FIG. 3(a) schematically illustrates principle of the present invention;

FIG. 3(b) schematically illustrates a layer wiring overlapping into an adjacent functional block;

FIG. 4 is a block diagram of a functional block fabricated on the wafer scale integrated circuit of the present invention;

DESCRIPTION OF THE PREFERRED EMBODIMENTS

Figure 1:
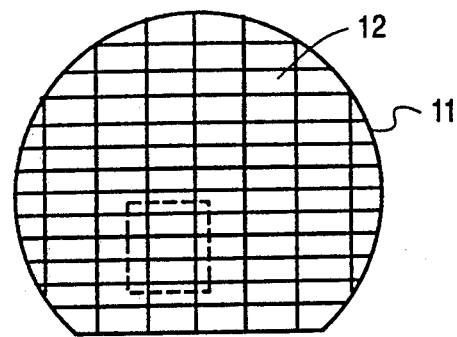
FIG. 1 schematically illustrates a wafer of a wafer-scale integrated circuit.
Figure 2A:
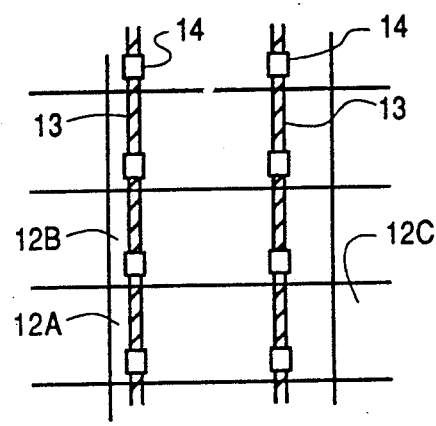
FIGS. 2a and 2b schematically illustrates prior art connections for supplying a voltage commonly to each of functional blocks in a wafer scale integrated circuit.
Figure 2B:
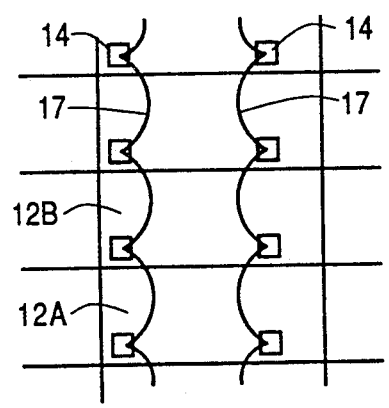

FIGS. 3(a) is a principle plan view schematically illustrating a preferred embodiment of the present invention. The numerals 12A, 12B, . . . of FIG. 3 indicate a plurality of functional blocks fabricated on a single wafer of 15 cm diameter shown in FIG. 1. Each of the functional blocks is for example, 13.65 mm ×4.4 mm in size, and comprises therein, for example, a 1M bit DRAM (Dynamic Random Access Memory) and its control circuit. Details of each functional block and the entire structure of the wafer will be explained later. Each functional block is fabricated, as is well known, by the step and repeat method in which a reticule having the pattern of the single functional block is repeatedly exposed by selecting the matrix position upon semiconductor wafer 11. Therefore, the connection terminals 14, provided for receiving power source voltages Vcc, Vss, etc. from circuits external to the functional block, are aligned on line. Layer wirings 13A, 13B, 13C... to supply the power source voltage, such as Vcc or Vss, to each functional block are typically about 50 μm wide, about 1 μm thick and typically formed of aluminum film, and are sequentially connected to corresponding power supply terminals 14A, 14B, 14C... of respective functional blocks 12A, 12B... aligned in a vertical line. The reticule pattern for fabricating layer wiring 13A of functional block 12A, to be connected to the adjacent functional block 12B, extends beyond the border line of the blocks into the adjacent block 12B as far as about 10 μm, as denoted by 13' shown in FIG. 3(b). Therefore, portion 13' of layer wiring 13 is deposited to overlap over layer wiring 13B of the next functional block 12B. Power supply terminals 14A, 14B, 14C... connected by respective layer wirings 13A, 13B, 13C... are sequentially connected in series by bonding wires 17A, 17B, 17C... of 30 to 100 μm diameter consisting of aluminum or gold, by means of, for example, the well-known ultrasonic bonding method, as shown in the figure. Thus, power source terminals 14 of each functional block are connected with each other by layer wirings 13 and duplicately by bonding wires 17.

As explained above, the functional blocks are as large as, for example, 13.65 mm ×4.4 mm for each and as many as two hundred or more may be mounted on a single wafer. Therefore, it is very hard to expect that all the functional blocks on the wafer are free from defects. However, since only a few functional blocks are defective in practice, a selective employment of only the defect-free functional blocks allows to achieve a 200M bit memory. All the functional blocks are tested in advance with a probe so as to detect defective functional blocks, and the thus obtained positional information of the defective blocks is stored in an EPROM (Erasable Programmable Read Only Memory) mounted on the carrier supporting the wafer thereon. Based on the positional information of the defective functional blocks, each of the functional blocks is instructed as to which one of four surrounding blocks (east, west, south and north) the memory information should be transmitted to. A control circuit, which upon receiving the instruction establishes a signal connection to the instructed adjacent functional block, is called a configuration logic and is, therefore, provided in each functional block.

Structure of the functional block is shown in the block diagram of FIG. 4. A part 20 enclosed by dotted lines indicates the configuration logic. The configuration logic comprises command decoder 21, Vcc switch 22, DRAM interface refresh counter 23, direction selector 24 and multiplexers 25 and 26. Command decoder 21 receives and decodes an instruction CMND input from an external circuit synchronously with a synchronization signal WCK, so as to issue instructions to other circuits in the functional block. Vcc switch 22 controls supply of power source voltage Vcc to DRAM 30. DRAM interface refresh counter 23 generates signals required for the operation of DRAM 30, such as load address strobe signals, column address strobe signals, write enable signals, output-enable signals and address signals, in response to a signal supplied from command decoder 21. These signals are used for read/write and refresh operations of DRAM 30. Direction selector 24 issues an instruction to receiving multiplexer 25 and sending multiplexer 26 respectively to instruct as to which one of adjacent functional blocks the signal should be received from, as well as to which one of the adjacent functional blocks the signal should be sent. Receiving multiplexer 25 selectively connects only the corresponding one of the input terminals respectively receiving the signals RECV-N, E, S and W from the four adjacent functional blocks. The last character of these signal names respectively denotes the connection with North, East, South or West adjacent blocks, and their terminals are respectively provided on the North, East, South and West sides in each functional block. Sending multiplexer 26 selectively connects only one of the output terminals of signals XMIT-N, E, S and W respectively to the four adjacent functional blocks. The selective connections of these input and output terminals are all carried out by a program based on the positional information of defective functional blocks, as already described. Thus, the memory information is transmitted only via the defect-free functional blocks and the DRAM information of each functional block is serially input/output from/to the outside of wafer 11. In this way, a DRAM of as many as 200M bits can be fabricated on a single wafer without practically harming its production yield. The wafer scale IC memory described above has been reported, entitled as "200 Mb WAFER MEMORY", by N. Macdonald et al. on 1989 IEEE ISSCC DIGEST of TECHNICAL PAPERS, p.240 -241. In this report, the functional block is called a chip.

Figure 5:
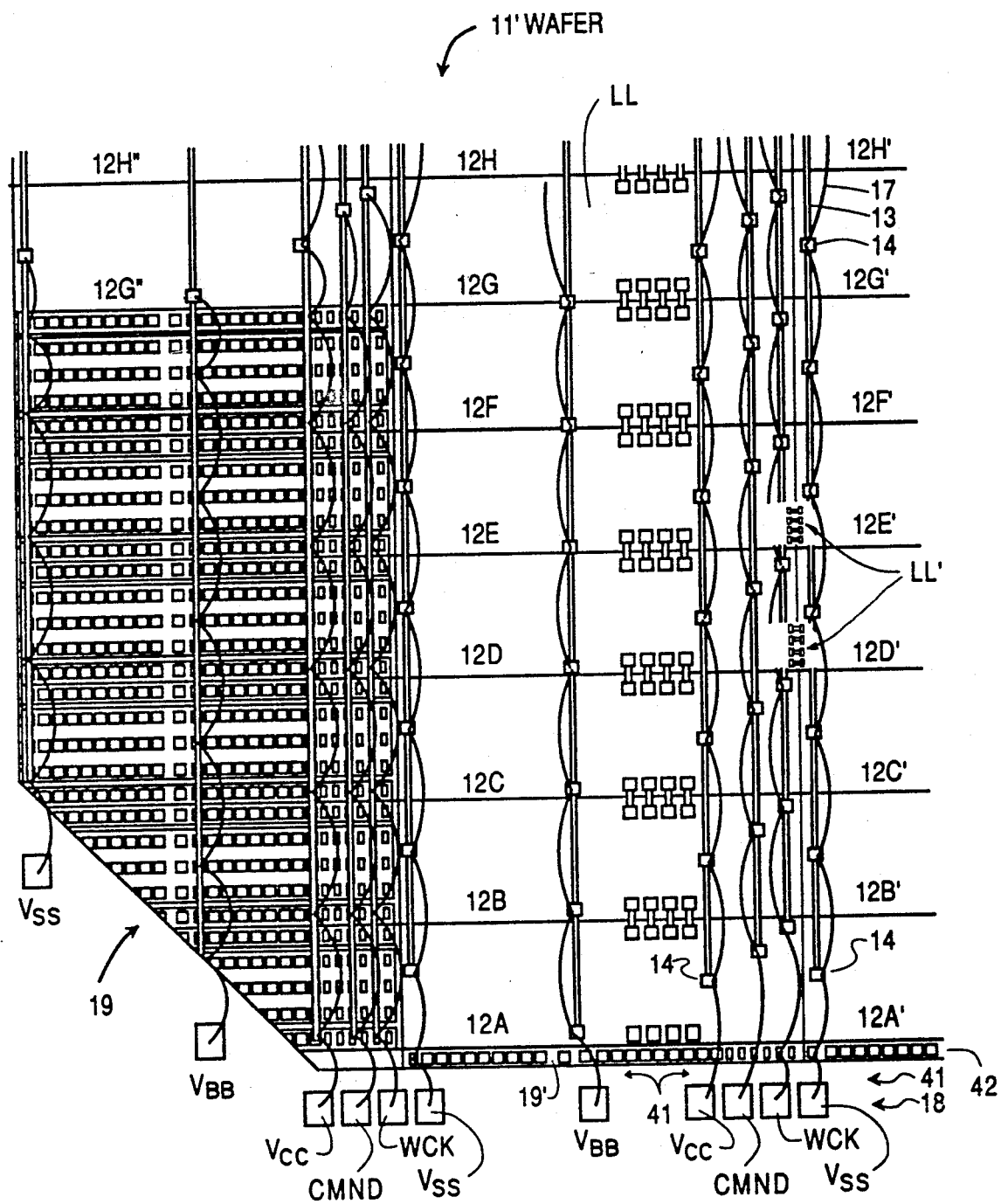
FIG. 5 shows a preferred embodiment of the present invention.

FIG. 5 shows a partially enlarged, detail view of the FIG. 3(a) principle drawing of the present invention. On wafer 11', unusable arc portions located at the periphery of wafer 11 of FIG. 1 are cut away. The connecting terminals respectively receiving in parallel the voltages and signals from external circuits, for example, the Vcc power supply terminal, Vbb substrate voltage terminal, clock (WCK) terminal and command (CMND) terminal, provided in respective functional blocks 12A, 12B, 12C... aligned in a vertical line, are connected with each other in double by layer wiring 13 and bonding wires 17. In order to supply these voltages to these double wirings, there are provided a plurality of connection terminals 42 in an extra block 19' provided at a peripheral, or outside, edge of the functional blocks 12A and 12A'. Each of the connection terminals 42 is connected to a respective one of the connection terminals 14 in functional blocks 12A and 12B, and to a respective one of the external terminals 18 by wire bonding 41. In other words, each connection terminal 42 functions as a relay terminal between the external source and the functional blocks. Thus, power source voltages and signals are input in parallel to each of the functional blocks.

Blocks 19, which are located at the periphery of wafer 11' and are unusable as a functional block, are provided with connecting terminals, i.e. pads, for extending the wirings, so that these pads which are aligned vertically are connected with each other in double by the layer wiring and by the bonding wires in order to supply the power source voltage to the functional blocks 12G", 12H" . . . aligned vertically to these unusable blocks 19.

Moreover, there are provided local wiring LL for sending/receiving signals between the vertically adjacent functional blocks, for example, 12F and 12G, and local wiring LL' for sending/receiving signals between the horizontally adjacent functional blocks, for example, between 12D and 12D', and between 12E and 12E' shown in FIG. 5. In FIG. 5, some of the wirings for the power source voltage Vss and clock WCK are partly omitted in order to draw the local wiring LL'. These local wirings LL and LL' are formed only with the layer wiring made of aluminum; this is permissible because the connections provided thereby are not serial, like the wirings for the power source voltage or the clock signal, and thus will cause much less influence, even if one of the connections becomes defective. However, it is apparent that the duplicated wirings according to the present invention can also be applied thereto, resulting in an advantageous effect. Moreover, though not illustrated in FIG. 4, each functional block 20 is provided with layer wiring LL of FIG. 5 for sending/receiving signals RECV/XMIT to/from the adjacent functional blocks.

Figure 6:
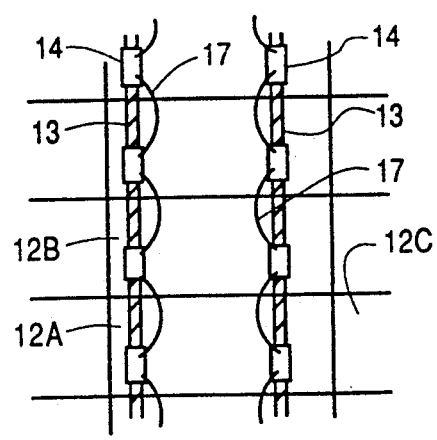
FIG. 6 schematically illustrates a second preferred embodiment of the present invention.

FIG. 6 is a plan view indicating the principle of a second preferred embodiment of the present invention. The elements like those in FIG. 3(a) are designated with the like reference numerals. FIG. 6 is different from FIG. 3(a) only in the method of wire bonding. As shown in FIG. 6, each bonding wire 17 is cut for each connection terminal 14 and the welding positions of the ends of two bonding wires 17 at the corresponding connection terminal 14 are displaced, i.e., spaced apart, at the corresponding connection terminal 14.

In the double wiring structure of the present invention, the layer wiring is superior in its vibration-proof characteristics even though leaving a problem in the patterning with a reticule, on the other hand, the wire bonding is superior in reliability even though leaving a problem in the vibration-proof characteristics. Thus, the double wirings having different failure modes remarkably improves the reliability of the wiring. Particularly in the structure for branching voltages, such as the power source voltage or clock signal, to each of the functional blocks via the serial wirings, the improvement in the reliability of wirings directly contributes to the improvement in reliability of the devices.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications are equivalents may be resorted to, falling within the scope of the invention.

What we claim is:

1. A semiconductor wafer-scale integrated-circuit comprising:
   a single wafer;
   a plurality of functional blocks formed on said wafer;
   a plurality of respectively corresponding connection terminals provided in each of said functional blocks;
   a plurality of layered wirings interconnecting respective and predetermined ones of said respectively corresponding connection terminals of said plurality of functional blocks; and
   a plurality of bonding wires corresponding to said plurality of layered wirings and interconnecting the same said predetermined and respective ones of said connection terminals of said functional blocks, in addition to and electrically in parallel to said corresponding layered wirings.

2. A semiconductor wafer-scale integrated-circuit as recited in claim 1, wherein said connection terminals comprise supply voltage terminals of each said functional block, said plurality of corresponding layered wirings and bonding wires conducting respective supply voltages in common to the respective and predetermined connection terminals respectively interconnected thereby, and correspondingly to said functional blocks.

3. A semiconductor wafer-scale integrated-circuit as recited in claim 1, wherein said supply voltage is a power-source voltage.

4. A semiconductor wafer-scale integrated-circuit as recited in claim 1, wherein said supply voltage is a clock signal voltage.

5. A semiconductor wafer-scale integrated-circuit as recited in claim 1, wherein said plurality of functional blocks are identical with each other.

6. A semiconductor wafer-scale integrated-circuit as recited in claim 1, wherein each of said functional blocks is fabricated according to a step and repeat method.

7. A semiconductor wafer-scale integrated-circuit as recited in claim 1, wherein each of said functional blocks comprises semiconductor memory cells as well as a configuration logic circuit.

* * * * *

UNITED STATES PATENT AND TRADEMARK OFFICE
CERTIFICATE OF CORRECTION

PATENT NO. : 5,032,889
DATED : July 16, 1991
INVENTOR(S) : MURAO et al.

It is certified that error appears in the above-identified patent and that said Letters Patent is hereby corrected as shown below:

Col. 1, line 13, change "controlling" to --control--;
line 66, change "lowered" to --lower--.

Col. 2, line 1, change "twenty six" to --twenty-six--;
line 11, change "blocks" to --block--;
line 45, change "illustrates" to --illustrate--;
line 47, after "of" insert --the--.

Col. 4, line 64, after "i.e." insert --,--.

Col. 5, line 38, after "reticule," insert --;--

Col. 6, line 5, change "are" to --and--.

Signed and Sealed this

Thirteenth Day of July, 1993

Attest:

MICHAEL K. KIRK

*Attesting Officer*    *Acting Commissioner of Patents and Trademarks*

UNITED STATES PATENT AND TRADEMARK OFFICE
CERTIFICATE OF CORRECTION

PATENT NO. : 5,032,889
DATED : July 16, 1991
INVENTOR(S) : MURAO et al.

It is certified that error appears in the above-identified patent and that said Letters Patent is hereby corrected as shown below:

Title page, item [73] after "Fujitsu Limited, Kawasaki, Japan" insert --and Fujitsu VLSI Limited, Aichi, Japan--

Signed and Sealed this

First Day of March, 1994

Attest:

BRUCE LEHMAN

Attesting Officer

Commissioner of Patents and Trademarks